(12) United States Patent
Adimula et al.

(10) Patent No.: US 8,344,491 B2
(45) Date of Patent: Jan. 1, 2013

(54) MULTI-DIE BUILDING BLOCK FOR STACKED-DIE PACKAGE

(75) Inventors: Ravikumar Adimula, Chandler, AZ (US); Myung Jin Yim, Chandler, AZ (US)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 12/347,738

(22) Filed: Dec. 31, 2008

(65) Prior Publication Data

US 2010/0164085 A1    Jul. 1, 2010

(51) Int. Cl.
    *H01L 23/02*    (2006.01)
(52) U.S. Cl. ............... 257/686; 257/E23.085
(58) Field of Classification Search ........... 257/E23.001, 257/685–687, 777–781, 786, E23.085
See application file for complete search history.

(56) References Cited

U.S. PATENT DOCUMENTS

| | | | |
|---|---|---|---|
| 5,438,224 A | 8/1995 | Papageorge et al. | |
| 6,069,025 A | 5/2000 | Kim | |
| 6,137,164 A | 10/2000 | Yew et al. | |
| 7,071,547 B2 * | 7/2006 | Kang et al. | 257/686 |
| 2004/0099938 A1 | 5/2004 | Kang et al. | |
| 2006/0050497 A1 | 3/2006 | Goodwin | |
| 2006/0097402 A1 * | 5/2006 | Pu et al. | 257/777 |
| 2006/0113678 A1 * | 6/2006 | Roeters et al. | 257/777 |

FOREIGN PATENT DOCUMENTS

| | | |
|---|---|---|
| CN | 101771026 A | 7/2010 |
| DE | 102006009561 A1 | 9/2006 |
| DE | 102009050744 A1 | 7/2010 |
| JP | 2010157694 A | 7/2010 |

OTHER PUBLICATIONS

"Chinese Application Serial No. 200910222337.6, Office Action mailed Aug. 24, 2011", 18 pgs.
"Chinese Application Serial No. 200910222337.6, Response filed Dec. 9, 2011 to Office Action mailed Aug. 24, 2011", 6 pgs.
"German Application Serial No. 102009050744.2, Response filed Dec. 1, 2011 to Office Action mailed Aug. 11, 2011", 22 pgs.
"German Application Serial No. 303.B89DE1, Office Action mailed Aug. 11, 2011", 9 pgs.

* cited by examiner

*Primary Examiner* — Hoa B Trinh
(74) *Attorney, Agent, or Firm* — Schwegman, Lundberg & Woessner, P.A.

(57) ABSTRACT

A multi-die building block for a stacked-die package is described. The multi-die building block includes a flex tape having a first surface and a second surface, each surface including a plurality of electrical traces. A first die is coupled, through a first plurality of interconnects, to the plurality of electrical traces of the first surface of the flex tape. A second die is coupled, through a second plurality of interconnects, to the plurality of electrical traces of the second surface of the flex tape.

21 Claims, 4 Drawing Sheets

MULTI-DIE BUILDING BLOCK FOR STACKED-DIE PACKAGE

TECHNICAL FIELD

Embodiments of the invention are in the field of semiconductor packaging and, in particular, multi-die building blocks for stacked die packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. On the other hand, although scaling is typically viewed as a reduction in size, the number of semiconductor die sought for inclusion in a semiconductor package may in fact be increasing in order to include multi-functional components or increased capacity within a single package.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate. However, this approach may be limited by the size of the mounting area and may not readily accommodate stacked die.

On the other hand, conventional wire-bonding approaches may limit the number of semiconductor die that can reasonably be included in a single semiconductor package. Furthermore, general structural issues may arise when attempting to package a large number of semiconductor die in a semiconductor package. Accordingly, additional improvements are needed in the evolution of semiconductor packages.

DETAILED DESCRIPTION

A multi-die building block for a stacked-die package is described herein. In the following description, numerous specific details are set forth, such as specific dimensions, in order to provide a thorough understanding of embodiments of the present invention. It will be apparent to one skilled in the art that embodiments of the present invention may be practiced without these specific details. In other instances, well-known functionalities, such as specific semiconductor die functionalities, are not described in detail in order to not unnecessarily obscure embodiments of the present invention. Furthermore, it is to be understood that the various embodiments shown in the Figures are illustrative representations and are not necessarily drawn to scale.

Disclosed herein are multi-die building blocks for stacked-die packages. In an embodiment, a multi-die building block includes a flex tape having a first surface and a second surface, each surface including a plurality of electrical traces. A first die is coupled, through a first plurality of interconnects, to the plurality of electrical traces of the first surface of the flex tape. A second die is coupled, through a second plurality of interconnects, to the plurality of electrical traces of the second surface of the flex tape. In an embodiment, a method for fabricating a multi-die building block for a stacked-die package includes providing a flex tape having a first surface and a second surface, each surface comprising a plurality of electrical traces. A first die is coupled, through a first plurality of interconnects, to the plurality of electrical traces of the first surface of the flex tape. A second die is coupled, through a second plurality of interconnects, to the plurality of electrical traces of the second surface of the flex tape.

In accordance with an embodiment of the present invention, forming and then stacking multi-die building blocks enables greater flexibility for stacked-die packages. For example, in one embodiment, each multi-die building block has its own central flex tape that bonds the die together. The use of flex tape and multi-die building blocks allows for replacement of most, if not all, of the wire-bonding conventionally used to package such die. Thus, in an embodiment, the complexity of a wire-bonding array is removed as an issue when stacking many die together into a single package. Furthermore, in an embodiment, the use of flex tape and multi-die building blocks allows for easier integration of both memory and logic die together. In another embodiment, the use of flex tape and multi-die building blocks allows for easier integration of die of differing size.

Figure 1:
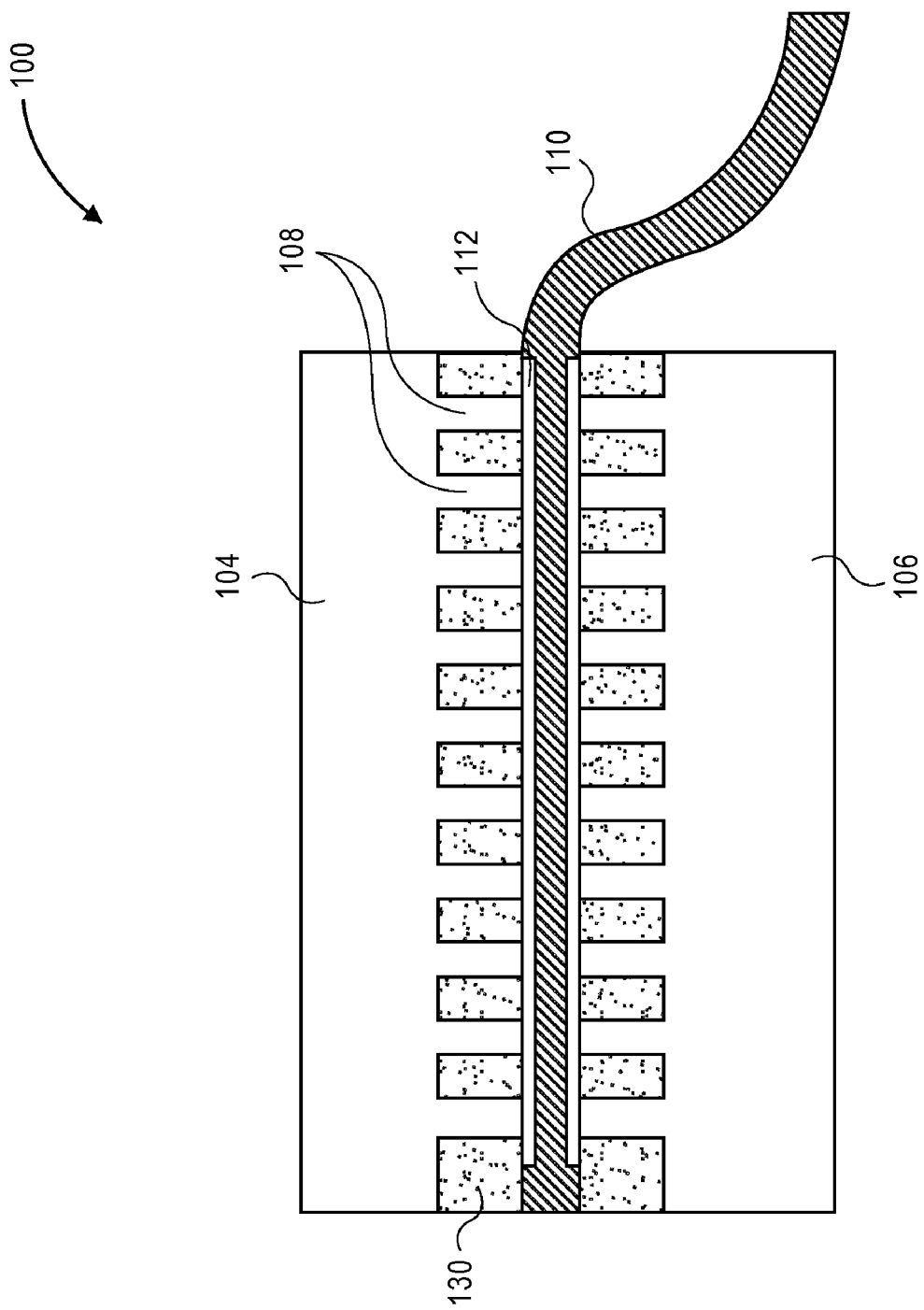
FIG. 1 illustrates a cross-sectional view of a two-die building block for a stacked-die package, in accordance with an embodiment of the present invention.

A multi-die building block may be fabricated for use in a semiconductor package. FIG. 1 illustrates a cross-sectional view of a two-die building block for a stacked-die package, in accordance with an embodiment of the present invention.

Referring to FIG. 1, a two-die building block 100 for a stacked-die package includes a first die 104 and a second die 106. Each of first die 104 and second die 106 includes thereon a plurality of interconnects 108. Two-die building block 100 also includes a flex tape 110 having a first surface and a second surface. Each surface includes a plurality of electrical traces 112. In accordance with an embodiment of the present invention, first die 104 is coupled, through a first plurality of interconnects 108, to the plurality of electrical traces 112 of the first surface of flex tape 110. Additionally, second die 106 is coupled, through a second plurality of interconnects, to the plurality of electrical traces of the second surface of flex tape 110.

Figure 2:
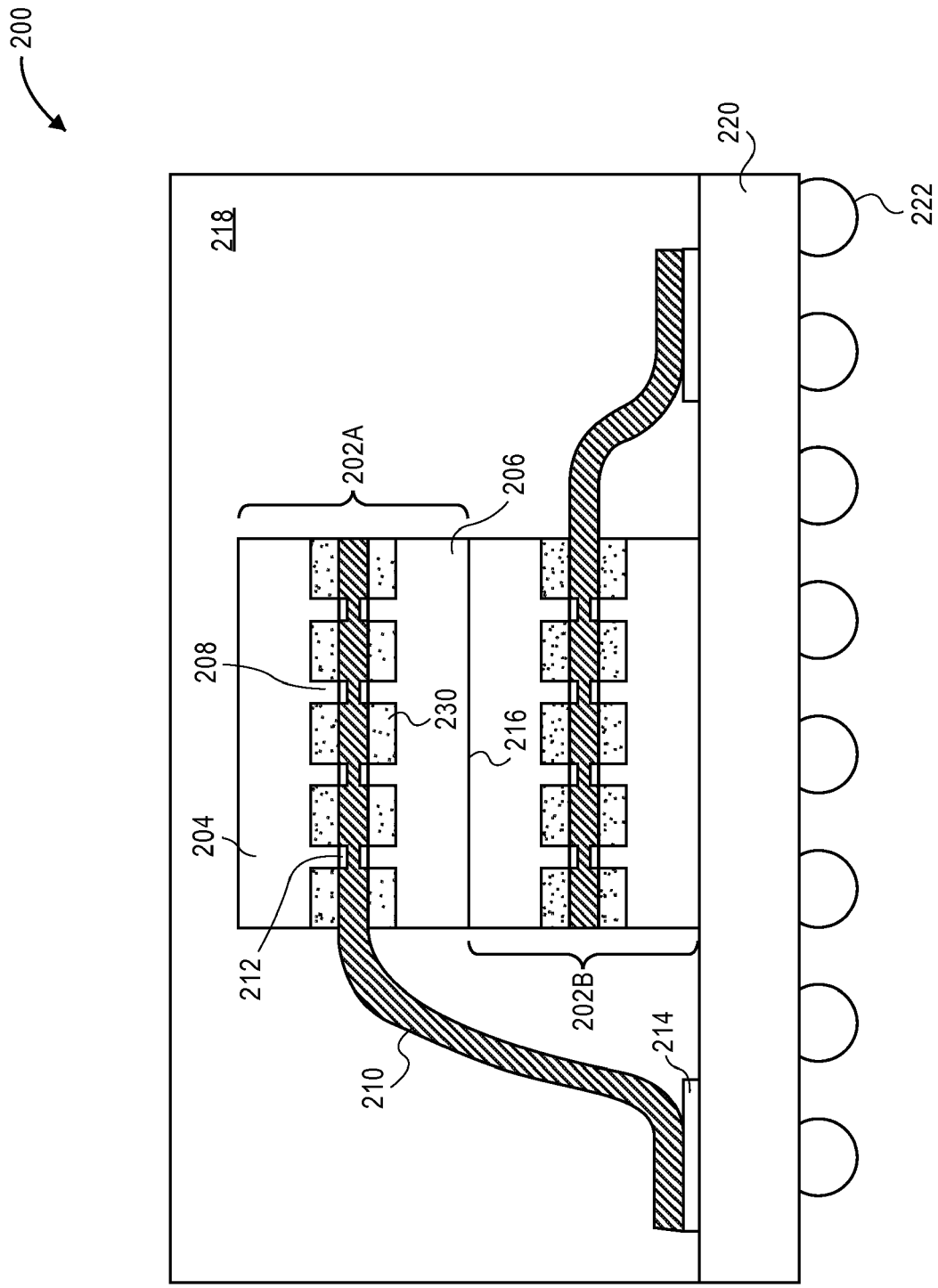
FIG. 2 illustrates a cross-sectional view of a stacked-die package including a pair of two-die building blocks, in accordance with an embodiment of the present invention.

In an embodiment, flex tape 110 is composed of a polyimide material and the pluralities of electrical traces 112 are composed of copper. In one embodiment, the surface of the copper is finished with nickel and gold. In one embodiment, flex tape 110 has a thickness between first die 104 and second die 106, the thickness approximately in the range of 15-75 microns, and each of the pluralities of electrical traces 112 has a thickness between first die 104 and second die 106, the thickness approximately in the range of 10-20 microns. The actual layout of the pluralities of electrical traces 112 may differ, depending on a particular application. For example, in an embodiment, the pluralities of electrical traces 112 each include continuous conductive lines that run parallel along the direction of each of the pluralities of interconnects shown in the cross-section, as depicted in FIG. 1. In another embodiment, the pluralities of electrical traces 112 each include continuous conductive lines that run perpendicular along the direction of each of the pluralities of interconnects shown in the cross-section, as depicted in FIG. 2 (see, e.g., element 212 of FIG. 2, described below).

In accordance with an embodiment of the present invention, each of the pluralities of interconnects 108 is composed of an array of metal bumps, and an electrically conductive adhesive 130 is interspersed between each metal bump, as depicted in FIG. 1. In one embodiment, each metal bump of each of the arrays of metal bumps is composed of a metal such as, but not limited to, copper, gold, or nickel. Electrically conductive adhesive 130 may be a material suitable for bump-to-trace adhesion. In an embodiment, electrically conductive adhesive 130 is composed of an anisotropically conductive adhesive. In one embodiment, electrically conductive adhesive 130 is composed of a material such as, but not limited to, an anisotropically conductive epoxy acrylate paste or film.

First die 104 and second die 106 may be any suitable individual semiconductor chips used in the electronics industry, and need not be identical in form or functionality. In one embodiment, first die 104 or second die 106 is an array of memory cells or a microprocessor formed on a slice of monocrystalline silicon. In another embodiment, first die 104 or second die 106 is a diode formed on a III-V material slice. First die 104 or second die 106 may have a surface having a micro-electronic integrated circuit formed thereon. In one embodiment, first die 104 or second die 106 has a surface including an array of CMOS transistors on the same side of the die as the plurality of interconnects 108. In an embodiment, first die 104 or second die 106 has a thickness approximately in the range of 350-800 microns.

A plurality of multi-die building blocks may be included in a semiconductor package. FIG. 2 illustrates a cross-sectional view of a stacked-die package including a pair of two-die building blocks, in accordance with an embodiment of the present invention.

Referring to FIG. 2, a semiconductor package 200 includes a substrate 220. A stacked plurality of two-die building blocks (e.g. two-die building block 202A+ two-die building block 202B, as depicted in FIG. 2) is coupled to a surface of substrate 220. Each two-die building block 202A or 202B includes a flex tape 210 having a first surface and a second surface, each surface including a plurality of electrical traces 212. A first die 204 is coupled, through a first plurality of interconnects 208, to the plurality of electrical traces 212 of the first surface of flex tape 210. A second die 206 is coupled, through a second plurality of interconnects, to the plurality of electrical traces of the second surface of flex tape 210. A molding 218 is disposed above substrate 220 and encapsulates the stacked plurality of two-die building blocks 202A+ 202B.

In accordance with an embodiment of the present invention, an end of flex tape 110 of each two-die building block 202A or 202B is coupled to the surface of substrate 220 by an electrically conductive adhesive 214. Electrically conductive adhesive 214 may be a material suitable for trace-to-trace adhesion. In an embodiment, electrically conductive adhesive 214 is composed of a material such as, but not limited to, an anisotropically conductive epoxy acrylate paste or film.

In an embodiment, semiconductor package 200 further includes an array of solder bumps 222 on a second, opposite, surface of substrate 220. Accordingly, in one embodiment, semiconductor package 200 is a ball-grid array (BGA) package, as depicted in FIG. 2. However, it is to be understood that embodiments of the present invention are not limited to BGA semiconductor packages. Substrate 220 may be a flexible substrate or a rigid substrate, depending upon the specific application. In an embodiment, substrate 220 has a plurality of electrical traces disposed therein for electrically coupling, via electrically conductive adhesive 214, to each flex tape 210.

In accordance with an embodiment of the present invention, flex tape 210 of each two-die building block 202A or 202B is composed of a polyimide material, and the pluralities of electrical traces 212 of each two-die building block 202A or 202B is composed of copper. In one embodiment, the surface of the copper is finished with nickel and gold. In one embodiment, flex tape 210 of each two-die building block 202A or 202B has a thickness between first die 204 and second die 206 of each two-die building block 202A or 202B, the thickness approximately in the range of 15-75 microns. In that embodiment, each of the pluralities of electrical traces 212 of each two-die building block 202A or 202B has a thickness between first die 204 and second die 206 of each two-die building block 202A or 202B, the thickness approximately in the range of 10-20 microns. The actual layout of the pluralities of electrical traces 212 may differ, depending on a particular application. For example, in an embodiment, the pluralities of electrical traces 112 each include continuous conductive lines that run perpendicular along the direction of each of the pluralities of interconnects shown in the cross-section, as depicted in FIG. 2. In another embodiment, the pluralities of electrical traces 212 each include continuous conductive lines that run parallel along the direction of each of the pluralities of interconnects shown in the cross-section, as depicted in FIG. 1 (see, e.g., element 112 of FIG. 1, described above).

In an embodiment, each of the pluralities of interconnects 208 of each two-die building block 202A or 202B is composed of an array of metal bumps, and an electrically conductive adhesive 230 is interspersed between each metal bump, as depicted in FIG. 2. In one embodiment, each metal bump of each of the arrays of metal bumps is composed of a metal such as, but not limited to, copper, gold, or nickel. Electrically conductive adhesive 230 may be a material suitable for bump-to-trace adhesion. In an embodiment, electrically conductive adhesive 230 is composed of an anisotropically conductive adhesive. In one embodiment, electrically conductive adhesive 230 is composed of a material such as, but not limited to, an anisotropically conductive epoxy acrylate paste or film.

First die 204 and second die 206 may be semiconductor die such as those described in association with first die 104 and second die 106 of FIG. 1. Each two-die building block, e.g. 202A and 202B, may be bonded to one another at the back-surfaces of the stacked die, as depicted in FIG. 2. For example, in accordance with an embodiment of the present invention, two-die building blocks 202A and 202B are stacked and coupled at an interface 216. In one embodiment, a non-conductive die bonding paste or film, e.g. an epoxy resin, is used to couple two-die building blocks 202A and 202B at interface 216. A similar material may also be used to adhere two-die building block 202B to the top surface of substrate 220. Molding 218 may also be composed of a non-conductive material. In one embodiment, molding 218 is composed of a material such as, but not limited to, an epoxy resin composed of silica fillers.

It is to be understood that semiconductor packages contemplated within the spirit and scope of embodiments of the present invention are not limited to the specific arrangement described in association with FIG. 2. For example, in accordance with an embodiment of the present invention, more than two two-die building blocks are stacked above one another for packaging in a single semiconductor package. In an embodiment, several stacks of two-die building blocks are disposed approximately adjacent to one another on a single substrate for packaging in a single semiconductor package. In accordance with another embodiment of the present invention, a portion of the flex tape from at least one of the two-die building blocks is extended outside of a semiconductor package for external connectivity.

Figure 3:
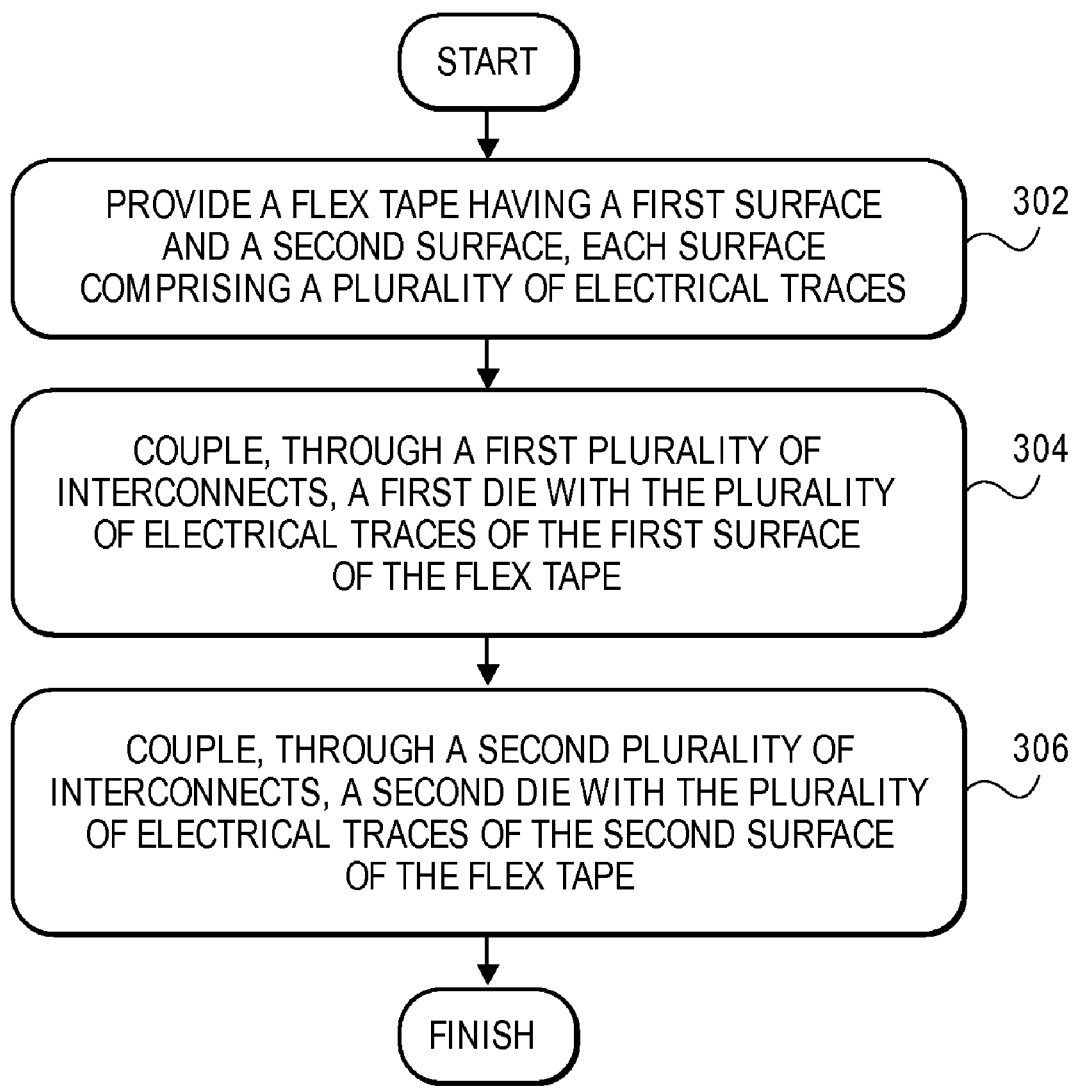
FIG. 3 illustrates a Flowchart representing operations in a method for fabricating a two-die building block for a stacked-die package, in accordance with an embodiment of the present invention.

A multi-die building block may be fabricated, by a coupling process, for use in a semiconductor package. FIG. 3 illustrates a Flowchart 300 representing operations in a method for fabricating a two-die building block for a stacked-die package, in accordance with an embodiment of the present invention.

Referring to operation 302 of Flowchart 300, a method for fabricating a two-die building block for a stacked-die package includes providing a flex tape having a first surface and a second surface, each surface comprising a plurality of electrical traces. In accordance with an embodiment of the present invention, providing the flex tape includes providing a polyimide material including pluralities of copper electrical traces. In one embodiment, the surface of the copper is finished with nickel and gold. In one embodiment, the flex tape has a region with a thickness approximately in the range of 15-75 microns, the region being a location where semiconductor die will be attached to the flex tape. In that embodiment, each of the pluralities of electrical traces has a thickness, in the region, approximately in the range of 10-20 microns.

Referring to operation 304 of Flowchart 300, through a first plurality of interconnects, a first die is coupled to the plurality of electrical traces of the first surface of the flex tape. In accordance with an embodiment of the present invention, the first plurality of interconnects is composed of an array of metal bumps, and an electrically conductive adhesive is interspersed between each metal bump. In one embodiment, each metal bump of the array of metal bumps is composed of a metal such as, but not limited to, copper, gold, or nickel.

Referring to operation 306 of Flowchart 300, through a second plurality of interconnects, a second die is coupled to the plurality of electrical traces of the second surface of the flex tape. In an embodiment, the second plurality of interconnects is composed of an array of metal bumps, and an electrically conductive adhesive is interspersed between each metal bump. In one embodiment, each metal bump of the array of metal bumps is composed of a metal such as, but not limited to, copper, gold, or nickel. In accordance with an embodiment of the present invention, coupling the first die and the second die to the pluralities of electrical traces of the flex tape includes heating to a temperature approximately in the range of 150-200 degrees Celsius for a duration approximately in the range of 5-20 seconds at a pressure approximately in the range of 1-10 MPa. In one embodiment, the heating operation is performed once, after both the first and second die have been coupled to the flex tape. In an alternative embodiment, the heating operation is performed twice, after the first die has been coupled to the flex tape and again after the second die has been coupled to the flex tape. Also, operations 304 and 306 may be performed in the distinct order described or at approximately the same time.

In an embodiment, after forming a two-die building block according to the operations 302, 304 and 306, the two-die building block is coupled to a surface of a substrate. In one embodiment, a molding is then formed above the substrate to encapsulate the two-die building block. In a specific embodiment, prior to forming the molding, one or more additional two-die building blocks are stacked above the two-die building block, and the molding encapsulates all of the stacked two-die building blocks. In an embodiment, an end of the flex tape of each two-die building block is coupled to the surface of the substrate by an electrically conductive adhesive. In another embodiment, an array of solder bumps is formed on a second surface of the substrate, and the semiconductor package is a BGA package.

Figure 4:
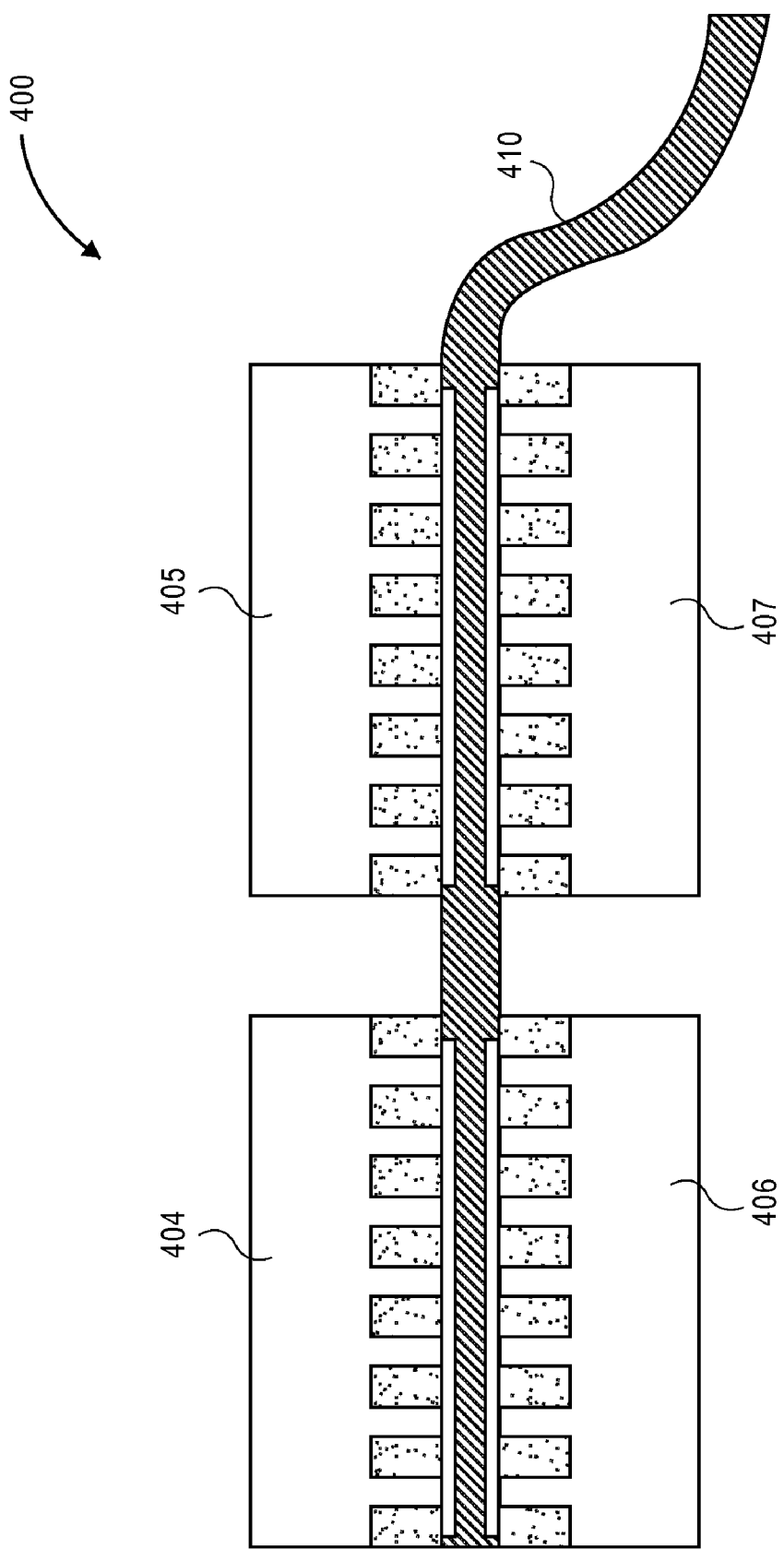
FIG. 4 illustrates a cross-sectional view of a four-die building block for a stacked-die package, in accordance with an embodiment of the present invention

Embodiments of the present invention are not limited to a two-die building block for use in a semiconductor package. For example, FIG. 4 illustrates a cross-sectional view of a four-die building block for a stacked-die package, in accordance with an embodiment of the present invention. Referring to FIG. 4, a four-die building block 400 for a stacked-die package includes a pairing of a first die 404 and a second die 406 as well as a pairing of a third die 405 and a fourth die 407. Four-die building block 400 includes a flex tape 410 to couple first die 404, second die 406, third die 405 and fourth die 407.

Thus, multi-die building blocks for stacked-die packages have been disclosed. In accordance with an embodiment of the present invention, a two-die building block includes a flex tape having a first surface and a second surface, each surface including a plurality of electrical traces. A first die is coupled, through a first plurality of interconnects, to the plurality of electrical traces of the first surface of the flex tape. A second die is coupled, through a second plurality of interconnects, to the plurality of electrical traces of the second surface of the flex tape. In one embodiment, the flex tape is composed of a polyimide material and the pluralities of electrical traces are composed of copper. In one embodiment, each of the pluralities of interconnects includes an array of metal bumps and an electrically conductive adhesive is interspersed between each metal bump.

What is claimed is:

1. A semiconductor package, comprising:
   a substrate;
   a stacked plurality of multi-die building blocks including a first multi-die building block and a second multi-die building block, the first and second multi-die building blocks being stacked and adjacent to each other, each of the first and second multi-die building blocks comprising:
      a flex tape having a first surface and a second surface, each surface comprising a plurality of electrical traces;
      a first die coupled, through a first plurality of interconnects, to the plurality of electrical traces of the first surface of the flex tape; and
      a second die coupled, through a second plurality of interconnects, to the plurality of electrical traces of the second surface of the flex tape,
   wherein the plurality of electrical traces of the first and second surfaces of the flex tape each include continuous conductive lines that run parallel to a direction of each of the first and second plurality of interconnects; and
   a molding disposed above the substrate and encapsulating the stacked plurality of multi-die building blocks,
   wherein an end of the flex tape of each of the first and second multi-die building blocks is coupled to a first surface of the substrate.

2. The semiconductor package of claim 1, further comprising:
   an array of solder bumps on a second surface of the substrate, wherein the semiconductor package is a ball-grid array (BGA) package.

3. The semiconductor package of claim 1, wherein the flex tape of each multi-die building block comprises a polyimide material and the pluralities of electrical traces of each multi-die building block comprise copper.

4. The semiconductor package of claim 3, wherein the flex tape of each multi-die building block has a thickness between the first and second die of each multi-die building block, the thickness approximately in the range of 15-75 microns, and wherein each of the pluralities of electrical traces of each multi-die building block has a thickness between the first and second die of each multi-die building block, the thickness approximately in the range of 10-20 microns.

5. The semiconductor package of claim 1, wherein each of the pluralities of interconnects of each multi-die building block comprises an array of metal bumps, and an electrically conductive adhesive is interspersed between each metal bump.

6. The semiconductor package of claim 5, wherein the electrically conductive adhesive is an anisotropically conductive adhesive.

7. The semiconductor package of claim 5, wherein each metal bump of each of the arrays of metal bumps comprises a metal selected from the group consisting of copper, gold, and nickel.

8. The semiconductor package of claim 1, wherein the plurality of multi-die building blocks comprises two two-die building blocks.

9. A semiconductor package, comprising:
   a substrate;
   a stacked plurality of multi-die building blocks including a first multi-die building block and a second multi-die building block, the first and second multi-die building blocks being laterally disposed and at least partially apart from each other, each of the first and second multi-die building blocks comprising:
      a flex tape having a first surface and a second surface, each surface comprising a plurality of electrical traces;
      a first die coupled, through a first plurality of interconnects, to the plurality of electrical traces of the first surface of the flex tape; and
      a second die coupled, through a second plurality of interconnects, to the plurality of electrical traces of the second surface of the flex tape,
   wherein the plurality of electrical traces of the first and second surfaces of the flex tape each include continuous conductive lines that run perpendicular to a direction of each of the first and second plurality of interconnects; and
   a molding disposed above the substrate and encapsulating the stacked plurality of multi-die building blocks, wherein an end of the flex tape of the first multi-die building block is connected to an end of the flex tape of the second multi-die building block.

10. The semiconductor package of claim 9, further comprising:
   an array of solder bumps on a second surface of the substrate, wherein the semiconductor package is a ball-grid array (BGA) package.

11. The semiconductor package of claim 9, wherein the flex tape of each multi-die building block comprises a polyimide material and the pluralities of electrical traces of each multi-die building block comprise copper.

12. The semiconductor package of claim 11, wherein the flex tape of each multi-die building block has a thickness between the first and second die of each multi-die building block, the thickness approximately in the range of 15-75 microns, and wherein each of the pluralities of electrical traces of each multi-die building block has a thickness between the first and second die of each multi-die building block, the thickness approximately in the range of 10-20 microns.

13. The semiconductor package of claim 9, wherein each of the pluralities of interconnects of each multi-die building block comprises an array of metal bumps, and an electrically conductive adhesive is interspersed between each metal bump.

14. The semiconductor package of claim 13, wherein the electrically conductive adhesive is an anisotropically conductive adhesive.

15. The semiconductor package of claim 13, wherein each metal bump of each of the arrays of metal bumps comprises a metal selected from the group consisting of copper, gold, and nickel.

16. The semiconductor package of claim 9, wherein the plurality of multi-die building blocks comprises two two-die building blocks.

17. The semiconductor package of claim 1, wherein the end of the flex tape of each of the first and second multi-die building blocks is coupled to the same surface of the substrate by an electrically conductive adhesive.

18. The semiconductor package of claim 1, wherein an opposite end of the flex tape of each of the first and second multi-die building blocks does not protrude from a side of a corresponding multi-die building block.

19. The semiconductor package of claim 9, wherein an opposite end of the first multi-die building block does not protrude from a side of the first multi-die building block.

20. The semiconductor package of claim 19, wherein an opposite end of the second multi-die building block is coupled to a surface of the substrate.

21. The semiconductor package of claim 20, wherein the opposite end of the second multi-die building block is coupled to the surface of the substrate by an electrically conductive adhesive.

* * * * *